(12) United States Patent
Song et al.

(10) Patent No.: US 12,040,304 B2
(45) Date of Patent: Jul. 16, 2024

(54) SEMICONDUCTOR PACKAGE AND METHOD OF FABRICATING THE SAME

(71) Applicant: Samsung Electronics Co., Ltd., Suwon-si (KR)

(72) Inventors: Eunseok Song, Hwaseong-si (KR); Kyung Suk Oh, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 18/061,008

(22) Filed: Dec. 2, 2022

(65) Prior Publication Data

US 2023/0099787 A1 Mar. 30, 2023

Related U.S. Application Data

(63) Continuation of application No. 16/944,231, filed on Jul. 31, 2020, now Pat. No. 11,532,591.

(30) Foreign Application Priority Data

Dec. 6, 2019 (KR) ........................ 10-2019-0161343

(51) Int. Cl.
*H01L 23/00* (2006.01)
*H01L 25/065* (2023.01)

(52) U.S. Cl.
CPC .......... *H01L 24/48* (2013.01); *H01L 25/0657* (2013.01)

(58) Field of Classification Search
CPC ........................... H01L 24/48; H01L 25/0657
See application file for complete search history.

(56) References Cited

U.S. PATENT DOCUMENTS

| | | |
|---|---|---|
| 8,072,064 B1 | 12/2011 | Lai et al. |
| 8,471,362 B2 | 6/2013 | Lee |
| 8,492,869 B2 | 7/2013 | Farooq et al. |
| 9,190,345 B1 | 11/2015 | Chen et al. |
| 9,263,422 B2 | 2/2016 | Droege et al. |
| 9,922,967 B2 | 3/2018 | Krasulick |
| 10,163,864 B1 | 12/2018 | England |
| 10,325,897 B2 | 6/2019 | Lee et al. |
| 10,354,975 B2 | 7/2019 | Soares et al. |
| 2012/0171814 A1 | 7/2012 | Choi et al. |
| 2013/0082397 A1 | 4/2013 | Crisp et al. |
| 2018/0190705 A1 | 7/2018 | Kilcoyne et al. |
| 2019/0295986 A1* | 9/2019 | Oh ........................ H01L 24/05 |
| 2020/0251447 A1* | 8/2020 | Kang ................... H01L 23/481 |

* cited by examiner

*Primary Examiner* — Walter H Swanson
(74) *Attorney, Agent, or Firm* — Myers Bigel, P.A.

(57) ABSTRACT

A semiconductor package includes a substrate, a die stack on the substrate, and connection terminals between the substrate and the die stack. The die stack includes a first die having a first active surface facing the substrate, the first die including first through electrodes vertically penetrating the first die, a second die on the first die and having a second active surface, the second die including second through electrodes vertically penetrating the second die, and a third die on the second die and having a third active surface facing the substrate. The second active surface of the second die is in direct contact with one of the first or third active surfaces.

20 Claims, 17 Drawing Sheets

SEMICONDUCTOR PACKAGE AND METHOD OF FABRICATING THE SAME

CROSS-REFERENCE TO RELATED APPLICATIONS

This U.S. non-provisional patent application is a continuation of and claims priority to U.S. patent application Ser. No. 16/944,231, filed Jul. 31, 2020, which claims priority under 35 U.S.C. § 119 to Korean Patent Application No. 10-2019-0161343, filed on Dec. 6, 2019, the entire contents of which are hereby incorporated by reference.

FIELD

The present disclosure relates to a semiconductor package and a method of fabricating the same, and in particular, to a semiconductor package including stacked integrated circuits and a method of fabricating the same.

BACKGROUND

A typical stacked package has a structure in which a plurality of substrates are stacked. For example, the stacked package may include semiconductor chips that are sequentially stacked on a printed circuit board (PCB). Each of the semiconductor chips may have connection pads. The semiconductor chips may be electrically connected to each other through bonding wires connecting the connection pads. A logic chip, which may be used to control the semiconductor chips, may be mounted on the printed circuit board.

Demand for portable electronic devices is rapidly increasing in the market, and it may thus be necessary to reduce size and weight of electronic components provided in the portable electronic devices. To this end, it may be desirable to develop a technology capable of reducing a size of each component as well as a semiconductor package technology of integrating a plurality of components on a single package. In particular, there may be demand for semiconductor packages that can be used to process high frequency signals with reduced size and improved electric characteristics.

SUMMARY

Some embodiments of the inventive concepts provide a semiconductor package with improved electrical characteristics and methods of fabricating the same.

Some embodiments of the inventive concepts provide a semiconductor package with improved heat-dissipation properties and methods of fabricating the same.

According to an embodiment of the inventive concepts, a semiconductor package may include a substrate, a die stack on the substrate, and connection terminals between the substrate and the die stack. The die stack may include a first die having a first active surface opposite to the substrate, the first die including first through electrodes vertically penetrating the first die; a second die on the first die and having a second active surface, the second die including second through electrodes vertically penetrating the second die; and a third die on the second die and having a third active surface facing the substrate. The second active surface of the second die may be in direct contact with one of the first or third active surfaces.

According to an embodiment of the inventive concepts, a semiconductor package may include a substrate, a logic die on the substrate and comprising a first active surface that faces the substrate, a passive device die between the substrate and the logic die and comprising a second active surface that is in contact with the first active surface, and a memory die between the substrate and the passive device die and comprising a third active surface that is in contact with a first inactive surface of the passive device die opposite to the second active surface. The logic die, the passive device die, and the memory die may further include first pads, second pads, and third pads, on the first active surface, the second active surface, and the third active surface, respectively. A respective pair of the first and second pads may define a unitary structure of a same material. The passive device die may be coupled to the third pads by first through electrodes that penetrate the passive device die.

According to an embodiment of the inventive concepts, a semiconductor package may include a first wafer comprising a first interconnection layer on a top surface thereof; a second wafer comprising a second interconnection layer on a top surface thereof, where the second wafer is on the first wafer such that the second interconnection layer is in contact with the first interconnection layer, and where the second wafer comprises a first through electrode that penetrates the second wafer, extends from the second interconnection layer toward a bottom surface of the second wafer that is opposite to the second interconnection layer, and is exposed adjacent the bottom surface of the second wafer; and a third wafer comprising a third interconnection layer on a top surface thereof, where the third wafer is on the second wafer such that the first through electrode is in contact with the third interconnection layer, and the third wafer comprises a second through electrode that penetrates the third wafer and pads that are on a bottom surface of the third wafer opposite to the top surface of the third wafer.

According to an embodiment of the inventive concepts, a method of fabricating a semiconductor package may include forming a first interconnection layer on a top surface of a first wafer, forming a second interconnection layer on a top surface of a second wafer, placing the second wafer on the first wafer such that the second interconnection layer is in contact with the first interconnection layer, forming a first through electrode to penetrate the second wafer, where the first through electrode extends from the second interconnection layer toward a bottom surface of the second wafer, which is opposite to the second interconnection layer, and is exposed adjacent the bottom surface of the second wafer, forming a third interconnection layer on a top surface of a third wafer, placing the third wafer on the second wafer such that the first through electrode is in contact with the third interconnection layer, and forming a second through electrode that penetrates the third wafer and pads that are provided on a bottom surface of the third wafer opposite to the top surface of the third wafer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
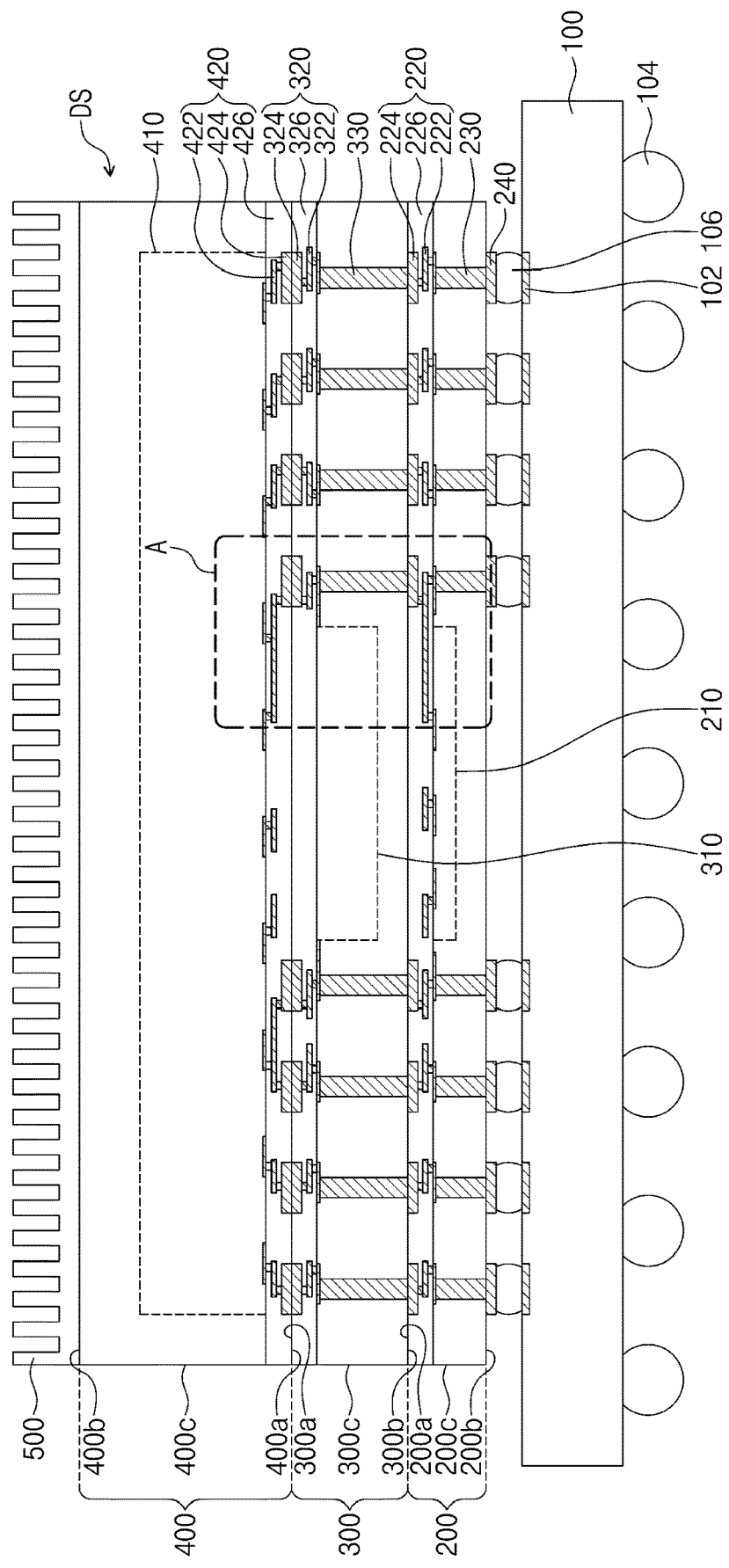
FIG. 1 is a sectional view illustrating a semiconductor package according to some embodiments of the inventive concept.
Figure 2:
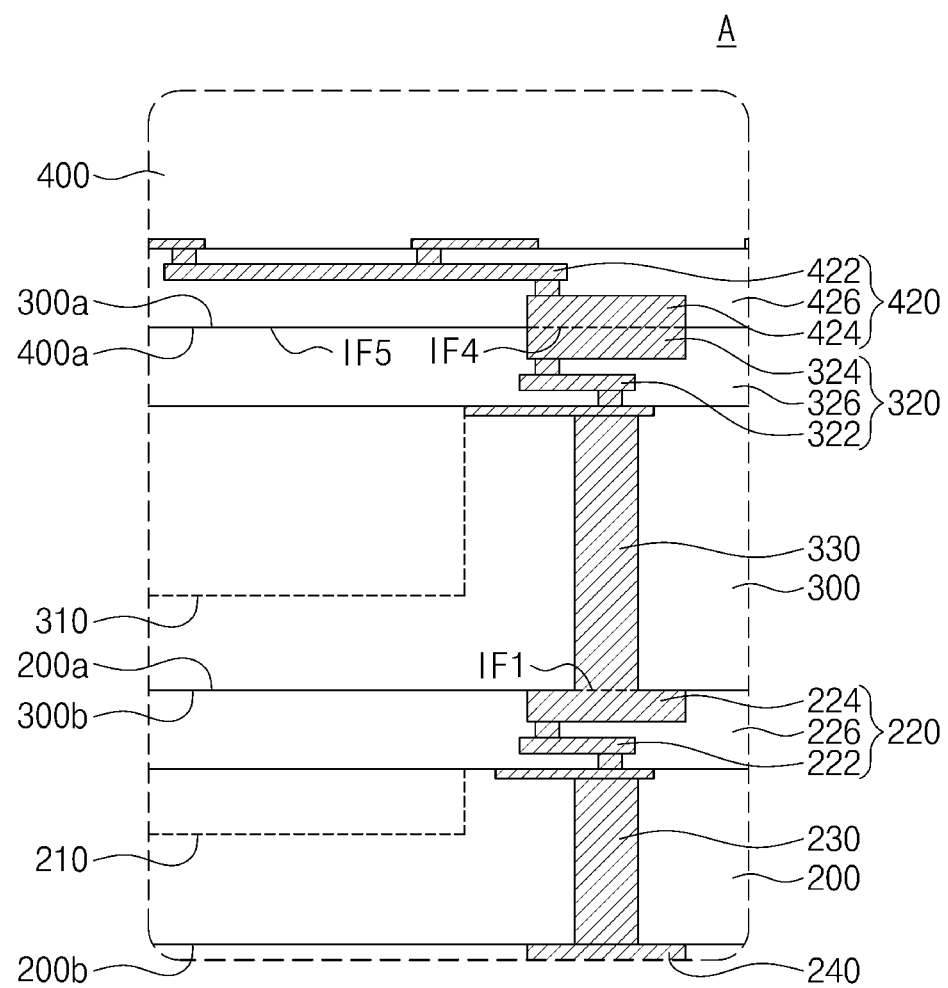
FIG. 2 is an enlarged sectional view of a portion 'A' of FIG. 1 according to some embodiments of the inventive concept.
Figure 3:
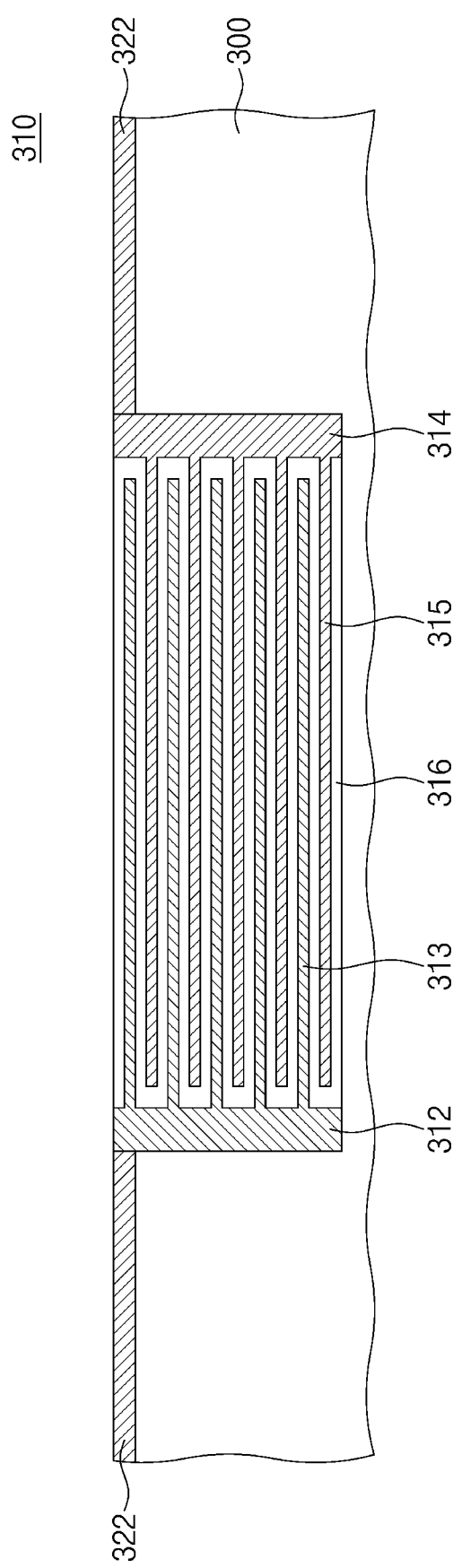
FIG. 3 is a diagram illustrating an example of a passive device according to some embodiments of the inventive concept.
Figure 4:
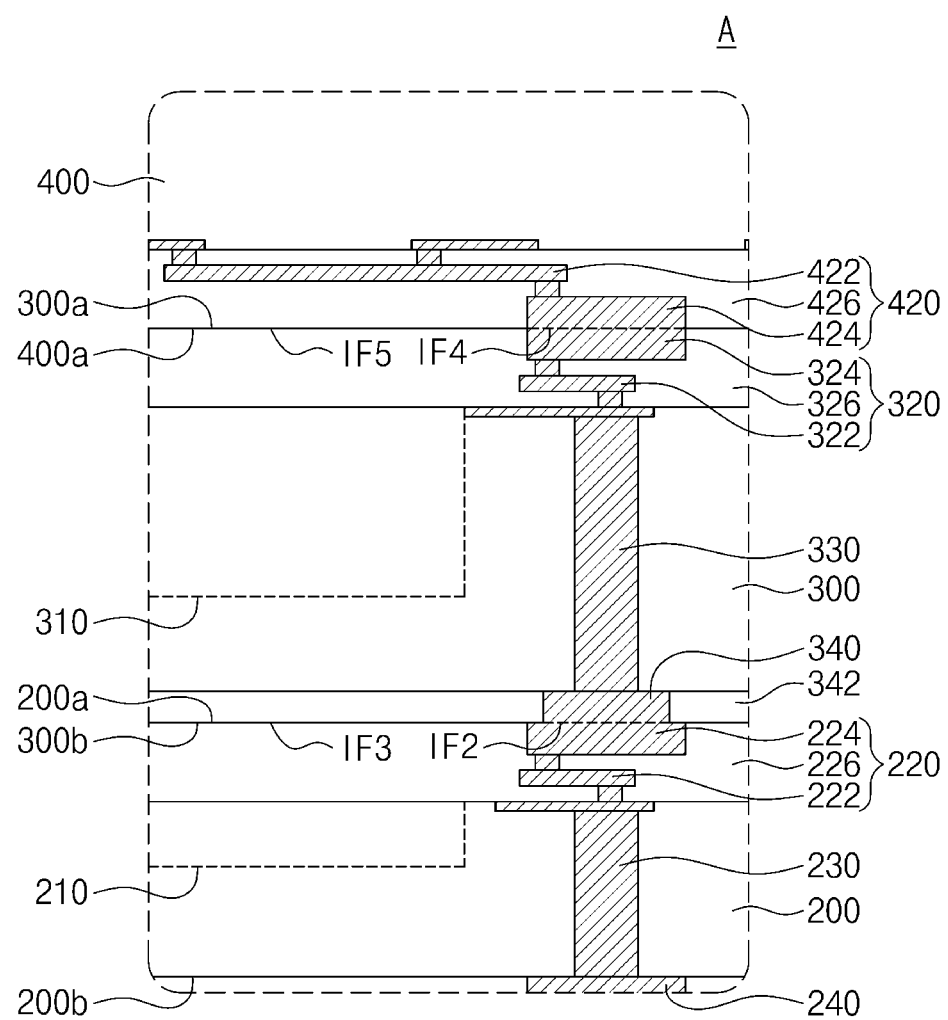
FIG. 4 is an enlarged sectional view of a portion 'A' of FIG. 1 according to some further embodiments of the inventive concept.

FIG. 1 is a sectional view illustrating a semiconductor package according to some embodiments of the inventive concept. FIG. 2 is an enlarged sectional view of a portion 'A' of FIG. 1 according to some embodiments. FIG. 3 is a diagram illustrating an example of a passive device. FIG. 4 is an enlarged sectional view of a portion 'A' of FIG. 1 according to some further embodiments.

Referring to FIGS. 1 and 2, a substrate 100 may be provided. The substrate 100 may include a printed circuit board (PCB), on which signal patterns are provided, or a silicon interposer substrate. In an embodiment, the substrate 100 may have a structure, in which insulating layers and interconnection layers are alternatingly stacked. The substrate 100 may include substrate pads 102 disposed on a top surface thereof.

Outer terminals 104 may be disposed under the substrate 100. In detail, the outer terminals 104 may be disposed on terminal pads, which are disposed on a bottom surface of the substrate 100. The outer terminals 104 may include solder balls or solder bumps, and the semiconductor package may be provided in the form of a ball grid array (BGA), a fine ball-grid array (FBGA), or a land grid array (LGA), depending on the kind or arrangement of the outer terminals 104.

A die stack DS may be disposed on the substrate 100. The die stack DS may include a first die 200, a second die 300, and a third die 400, which are sequentially stacked on the substrate 100. The terms "first," "second," "third," etc. are used herein merely to distinguish one element from another. Hereinafter, the structure of the die stack DS will be described in more detail.

The first die 200 may be a wafer-level semiconductor die, which is formed of a semiconductor material (e.g., silicon (Si)). The first die 200 may include a first integrated circuit 210 provided therein. The first integrated circuit 210 may include an electronic device (e.g., a transistor). For example, the first integrated circuit 210 may be a memory device. In an embodiment, the first die 200 may be or include one of DRAM, SRAM, MRAM, or FLASH memory devices.

The first die 200 may have a top surface 200a and a bottom surface 200b. In the present specification, the term "top surface" may refer to a surface, which is located near or adjacent an active surface of an integrated device in a semiconductor die, or a surface, on which pads of the semiconductor die are formed, and the term "bottom surface" may refer to a surface, which is opposite to the top surface or is located near or adjacent an inactive surface of the integrated device in the semiconductor die. For example, the first die 200 may include a first interconnection layer 220, which is disposed near or adjacent the top surface 200a of the first die 200.

The first interconnection layer 220 may include a first interconnection pattern 222, first die pads 224, and a first insulating layer 226. In an embodiment, the first interconnection pattern 222 may be provided in the first insulating layer 226. The first die pads 224 may be exposed to the outside or external to the first die 200, near or adjacent a surface of the first insulating layer 226. The first die pads 224 may have top surfaces that are coplanar with the surface of the first insulating layer 226. The first interconnection pattern 222 may be coupled to the first integrated circuit 210 of the first die 200 and may be connected to the first die pads 224. The first interconnection pattern 222 and the first die pads 224 may be formed of or include one or more conductive materials (e.g., metals). The first insulating layer 226 may be formed of or include one or more insulating materials (e.g., silicon oxide (SiO)).

The first die 200 may include first through electrodes 230. The first through electrodes 230 may be provided to vertically penetrate the first die 200. As used herein, "vertically penetrating" may refer to extension of an element (such as a through electrode) into or through a surface or layer (such as a semiconductor die), for example, in a direction substantially perpendicular to a horizontally-extending surface or layer. The first through electrodes 230 may be coupled to the first interconnection layer 220. The first through electrodes 230 may extend toward the bottom surface 200b of the first die 200 and may be exposed to the outside or external to the first die 200, near or adjacent the bottom surface 200b of the first die 200. The first die 200 may include first bottom pads 240, which are provided on the bottom surface 200b of the first die 200 and are coupled to the first through electrodes 230.

The first die 200 may be mounted on the substrate 100. As shown in FIG. 1, the first die 200 may be disposed on the substrate 100 to be in a face-up state, e.g., with the top surface 200a remote from or facing away from the substrate 100. For example, the first die 200 may be disposed in such a way that the bottom surface 200b of the first die 200 faces the substrate 100, and the first die 200 may be electrically connected to the substrate 100. In an embodiment, the first die 200 may be mounted on the substrate 100 in a flip chip manner. For example, connection terminals 106 may be provided between the first bottom pads 240, which are provided on the bottom surface 200b of the first die 200, and the substrate pads 102 of the substrate 100.

The second die 300 may be disposed on the first die 200. The second die 300 may be a wafer-level semiconductor die, which is formed of a semiconductor material (e.g., silicon (Si)). The second die 300 may include a passive device 310 provided therein. For example, the passive device 310 may be or include at least one of capacitors, resistors, or inductors. FIG. 3 illustrates an example of the passive device 310, and as shown in FIG. 3, the passive device 310 may be a capacitor which is provided in a recess penetrating a top surface 300a of the second die 300. The passive device 310 may include a first electrode 312 and a second electrode 314, which are spaced apart from each other in the recess, and a dielectric material 316, which is provided to fill a space between the first electrode 312 and the second electrode 314. The first electrode 312 and the second electrode 314 may be connected to a second interconnection pattern 322 of the second die 300. To increase the electrostatic capacitance of the passive device 310, the passive device 310 may further include first sub electrodes 313 and second sub electrodes 315, which are alternatingly disposed between the first electrode 312 and the second electrode 314. The first sub electrodes 313 may be connected to the first electrode 312, and the second sub electrodes 315 may be connected to the second electrode 314. An example of the passive device 310 has been described, but the inventive concept is not limited to this example. In some embodiments, the passive device 310 may include one or more circuit structures, in which at least one of capacitors, resistors, or inductors are provided.

The second die 300 may have a top surface 300a and a bottom surface 300b. For example, the second die 300 may include a second interconnection layer 320, which is provided near or adjacent the top surface 300a of the second die 300.

The second interconnection layer 320 may include a second interconnection pattern 322, second die pads 324, and a second insulating layer 326. For example, the second interconnection pattern 322 may be provided in the second insulating layer 326. The second die pads 324 may be exposed to the outside or external to the second die 300, near or adjacent a surface of the second insulating layer 326. The second die pads 324 may include top surfaces that are coplanar with the surface of the second insulating layer 326. The second interconnection pattern 322 may be coupled to the passive device 310 of the second die 300 and may be connected to the second die pads 324. The second interconnection pattern 322 and the second die pads 324 may be formed of or include one or more conductive materials (e.g., metals). The second insulating layer 326 may be formed of or include one or more insulating materials (e.g., silicon oxide (SiO)).

The second die 300 may include second through electrodes 330. The second through electrodes 330 may be provided to vertically penetrate the second die 300. The second through electrodes 330 may be coupled to the second interconnection layer 320. The second through electrodes 330 may extend toward the bottom surface 300b of the second die 300 and may be exposed to the outside or external to the second die 300, near or adjacent the bottom surface 300b of the second die 300.

The second die 300 may be mounted on the first die 200. As shown in FIG. 1, the second die 300 may be disposed on the first die 200 to be in a face-up state, e.g., with the top surface 300a remote from or facing away from the substrate 100. For example, the second die 300 may be disposed in such a way that the bottom surface 300b of the second die 300 faces the first die 200. Here, the bottom surface 300b of the second die 300 may be in contact with the top surface 200a of the first die 200. For example, the bottom surface 300b of the second die 300 may be in contact with a top surface of the first interconnection layer 220 (e.g., the first insulating layer 226).

The second die 300 may be provided on and bonded to the first die 200. In detail, at the level of the interface between the first die 200 and the second die 300, the first die pads 224 of the first die 200 may be in direct contact with the second through electrodes 330 of the second die 300. As used herein, when an element is described as being "directly on" or "in direct contact with" another element, no intervening elements are present. Here, the first die pads 224 and the second through electrodes 330 may form a metal-to-metal hybrid bonding structure. In the present specification, the term "hybrid bonding" may be used to refer to a bonding structure, in which two elements made of a material of the same kind are merged with each other at an interface therebetween. For example, the first die pads 224 and the second through electrodes 330 may form a substantially continuous structure, and it may be hard to detect (or may be substantially free of) an interface IF1 between the first die pads 224 and the second through electrodes 330. For example, the first die pads 224 and the second through electrodes 330 may be formed of the same material (e.g., copper (Cu)), and in this case, there may be no interface between the first die pads 224 and the second through electrodes 330. In other words, the first die pads 224 and the second through electrodes 330 may be provided as a single element or monolithic or unitary structure. The second die 300 and the first die 200 may be electrically connected to each other through the first die pads 224 and the second through electrodes 330. According to some embodiments of the inventive concept, the second through electrodes 330 and the first die pads 224 may be bonded to form a metal-to-metal bonding structure exhibiting a strong adhesion strength, and thus, the structural stability of the semiconductor package may be improved.

In an embodiment, the second die 300 may further include second bottom pads 340 and a bottom protection layer 342. As shown in FIG. 4, the second bottom pads 340 may be provided near or adjacent the bottom surface 300b of the second die 300 and may be coupled to the second through electrodes 330. The bottom protection layer 342 may be provided near or adjacent the bottom surface 300b of the second die 300 to surround the second bottom pads 340. A bottom surface of the bottom protection layer 342 and bottom surfaces of the second bottom pads 340 may be substantially coplanar with each other. The second bottom pads 340 may be formed of or include one or more conductive materials (e.g., metals). The bottom protection layer 342 may be formed of or include one or more insulating materials (e.g., silicon oxide (SiO)).

The second die 300 may be provided on and bonded to the first die 200. In detail, at the level of the interface between the first die 200 and the second die 300, the first die pads 224 of the first die 200 may be in direct contact with the second bottom pads 340 of the second die 300. Here, the first die pads 224 and the second bottom pads 340 may form the metal-to-metal hybrid bonding structure. For example, the first die pads 224 and the second bottom pads 340 may form a substantially continuous structure, and it may be hard to detect (or may be substantially free of) an interface IF2 between the first die pads 224 and the second bottom pads 340. In other words, the first die pads 224 and the second bottom pads 340 may be provided as a single element or unitary structure. The second die 300 and the first die 200 may be electrically connected to each other through the first die pads 224 and the second bottom pads 340. According to some embodiments of the inventive concept, the first die pads 224 and the second bottom pads 340 may be bonded to form a metal-to-metal bonding structure exhibiting a strong adhesion strength, and thus, the structural stability of the semiconductor package may be improved.

In some embodiments, the bottom protection layer 342 of the second die 300 and the first insulating layer 226 of the first interconnection layer 220 of the first die 200 may be bonded with each other. As shown in FIG. 4, the second die 300 may further include the second bottom pads 340 and the bottom protection layer 342. The second die 300 may be provided on and bonded to the first die 200. At the level of the interface between the first die 200 and the second die 300, the first die pads 224 of the first die 200 may be in direct contact with the second bottom pads 340 of the second die 300. Here, the first die pads 224 and the second bottom pads 340 may form the metal-to-metal hybrid bonding structure.

In addition, at the level of the interface between the first die 200 and the second die 300, the first insulating layer 226 of the first die 200 may be in direct contact with the bottom protection layer 342 of the second die 300. Here, the first insulating layer 226 and the bottom protection layer 342 may form an oxide-to-oxide hybrid bonding structure. For example, the first insulating layer 226 and the bottom protection layer 342 may form a substantially continuous structure, and it may be hard to detect (or may be substantially free of) an interface IF3 between the first insulating layer 226 and the bottom protection layer 342. For example, the first insulating layer 226 and the bottom protection layer 342 may be formed of the same material (e.g., silicon oxide (SiO)), and in this case, there may be no interface between the first insulating layer 226 and the bottom protection layer 342. In other words, the first insulating layer 226 and the bottom protection layer 342 may be provided as a single element or unitary structure. Further description is provided based on the embodiment of FIG. 2.

Referring again to FIGS. 1 and 2, the third die 400 may be disposed on the second die 300. The third die 400 may be a wafer-level semiconductor die, which is formed of a semiconductor material (e.g., silicon (Si)). The third die 400 may include a second integrated circuit 410 provided therein. The second integrated circuit 410 may include an electronic device (e.g., a transistor). For example, the second integrated circuit 410 may be a logic device. In other words, the third die 400 may be a logic chip.

The third die 400 may have a top surface 400a and a bottom surface 400b. For example, the third die 400 may include a third interconnection layer 420, which is provided near or adjacent the top surface 400a of the third die 400.

The third interconnection layer 420 may include a third interconnection pattern 422, third die pads 424, and a third insulating layer 426. For example, the third interconnection pattern 422 may be provided in the third insulating layer 426. The third die pads 424 may be exposed to the outside or external to the third die 400, near or adjacent a surface of the third insulating layer 426. The third die pads 424 may have bottom surfaces that are substantially coplanar with the surface of the third insulating layer 426. The third interconnection pattern 422 may be coupled to the second integrated circuit 410 of the third die 400 and may be connected to the third die pads 424. The third interconnection pattern 422 and the third die pads 424 may be formed of or include one or more conductive materials (e.g., metals). The third insulating layer 426 may be formed of or include one or more insulating materials (e.g., silicon oxide (SiO)).

The third die 400 may be mounted on the second die 300. As shown in FIG. 1, the third die 400 may be disposed on the second die 300 to be in a face-down state, e.g., with the bottom surface 400b facing away from the substrate 100. For example, the third die 400 may be disposed in such a way that the top surface 400a of the third die 400 faces the second die 300. Here, the top surface 400a of the third die 400 may be in contact with the top surface 300a of the second die 300. For example, the third interconnection layer 420 of the third die 400 and the second interconnection layer 320 of the second die 300 may be in contact with each other.

The third die 400 may be provided on and bonded to the second die 300. In detail, at the level of the interface between the second die 300 and the third die 400, the second die pads 324 of the second die 300 may be in direct contact with the third die pads 424 of the third die 400. Here, the second die pads 324 and the third die pads 424 may form the metal-to-metal hybrid bonding structure. For example, the second die pads 324 and the third die pads 424 may form a substantially continuous structure, and it may be hard to detect (or may be substantially free of) an interface IF4 between the second die pads 324 and the third die pads 424. For example, the second die pads 324 and the third die pads 424 may be formed of the same material (e.g., copper (Cu)), and in this case, there may be no interface between the second die pads 324 and the third die pads 424. In other words, the second die pads 324 and the third die pads 424 may be provided as a single element or unitary structure. The second die 300 and the third die 400 may be electrically connected to each other through the second die pads 324 and the third die pads 424.

In some embodiments, at the level of the interface between the second die 300 and the third die 400, the second insulating layer 326 of the second die 300 may be in direct contact with the third insulating layer 426 of the third die 400. Here, the second insulating layer 326 and the third insulating layer 426 may form the oxide-to-oxide hybrid bonding structure. For example, the second insulating layer 326 and the third insulating layer 426 may form a substantially continuous structure, and it may be hard to detect (or may be substantially free of) an interface IF5 between the second insulating layer 326 and the third insulating layer 426. For example, the second insulating layer 326 and the third insulating layer 426 may be formed of the same material (e.g., silicon oxide (SiO)), and in this case, there may be no interface between the second insulating layer 326 and the third insulating layer 426. In other words, the second insulating layer 326 and the third insulating layer 426 may be provided as a single element or unitary structure. Alternatively, the second insulating layer 326 and the third insulating layer 426 may be provided as separate elements.

The die stack DS may be provided to have the above-described structure. In the die stack DS, the first die 200, the second die 300, and the third die 400 may form a wafer-on-wafer (WOW) structure. A side surface 200c of the first die 200, a side surface 300c of the second die 300, and a side surface 400c of the third die 400 may be aligned to each other. In other words, the side surface 200c of the first die 200, the side surface 300c of the second die 300, and the side surface 400c of the third die 400 may be substantially coplanar with each other.

According to example embodiments of the inventive concept, the second interconnection layer 320 and the third interconnection layer 420 may be bonded to form the metal-to-metal or oxide-to-oxide bonding structure exhibiting a strong adhesion strength, and thus, the structural stability of the semiconductor package may be improved.

In some embodiments, the third die 400 serving as the logic die and the second die 300 including the capacitor may be bonded in such a way that their active surfaces face each other, and in this case, it may be possible to reduce a length of an electrical connection path between the second integrated circuit 410 of the third die 400 and the passive device 310 of the second die 300. Furthermore, since the second die 300 including the capacitor is directly connected to the third die 400 serving as the logic die, it may be possible to reduce noise in electrical signals output from the third die 400. Accordingly, the electric characteristics of the semiconductor package may be improved.

In some embodiments, the third die 400 may be disposed at the highest level of the die stack DS. The third die 400 serving as the logic die may generate a large amount of (or comparatively more) heat during operation, but since the third die 400 is disposed at the highest level, it may be possible to more easily exhaust or dissipate the heat of the third die 400.

A heat radiator 500 may be provided on the die stack DS. For example, the heat radiator 500 may be disposed to be in contact with the top surface of the die stack DS. The heat radiator 500 may be attached to the die stack DS using an adhesion film (not shown). In some embodiments, the adhesion film (not shown) may include a thermal interface material (TIM), such as a thermal grease. The heat radiator 500 may be used to exhaust or dissipate heat, which is generated by the die stack DS, to the outside or external to the package. The heat radiator 500 may include a heat sink. In an embodiment, the heat radiator 500 may not be provided.

Figure 5:
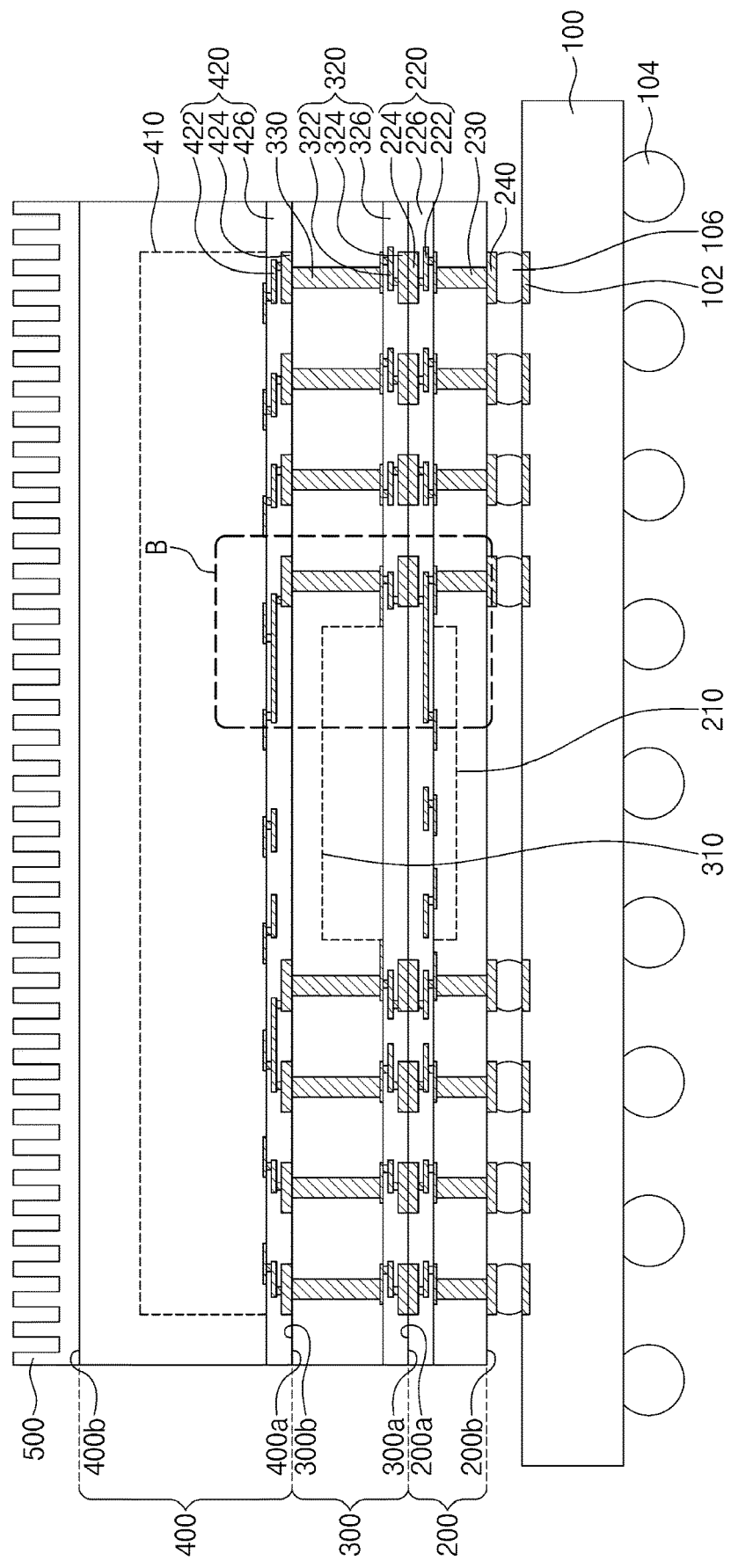
FIG. 5 is a sectional view illustrating a semiconductor package according to some embodiments of the inventive concept.
Figure 6:
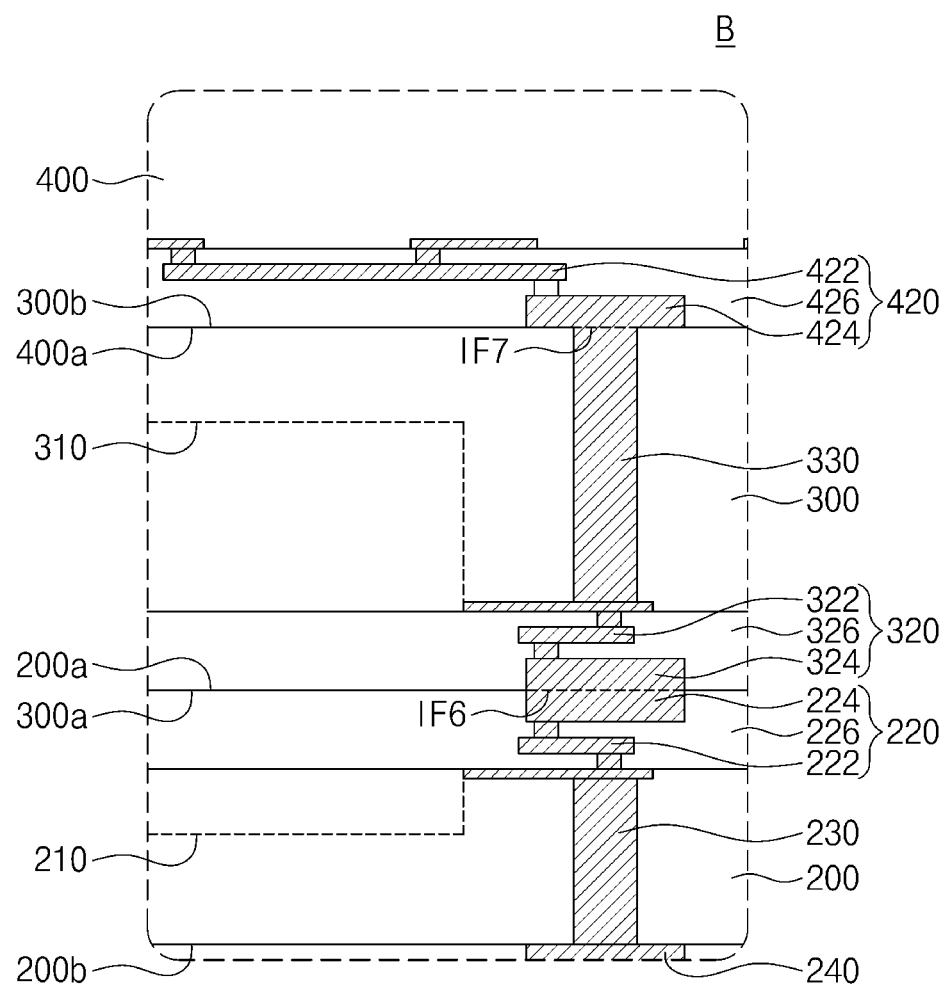
FIGS. 6 and 7 are enlarged sectional views, each of which illustrates a portion 'B' of FIG. 5 according to various embodiments of the inventive concept.
Figure 7:
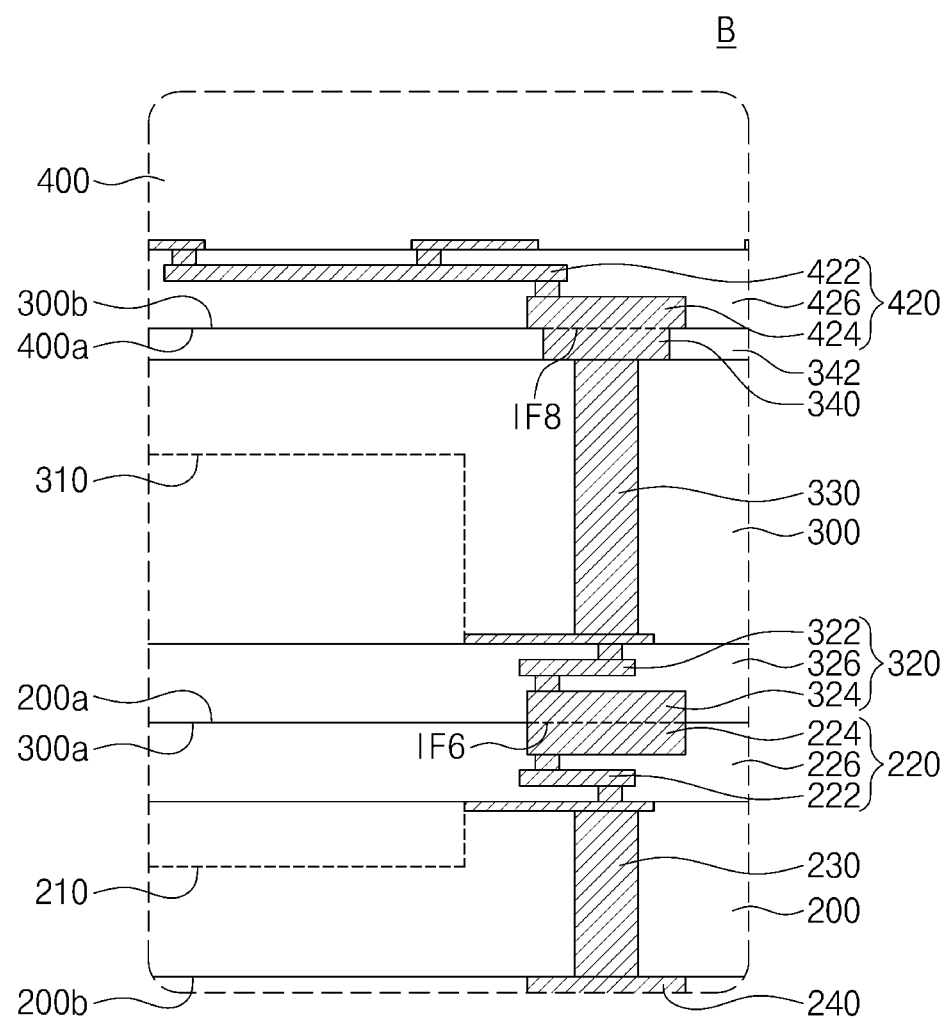

FIG. 5 is a sectional view illustrating a semiconductor package according to some embodiments of the inventive concept. FIGS. 6 and 7 are enlarged sectional views, each of which illustrates a different example of portion 13' of FIG. 5. In the following description of FIGS. 5 through 7, elements previously described with reference to FIGS. 1 to 4 may be identified by the same reference numbers without repeating the description thereof, for brevity. In other words, technical features that differ from the embodiments of FIGS. 1 to 4 will be mainly described in the following description.

Referring to FIGS. 5 and 6, the second die 300 may be mounted on the first die 200. As shown in FIG. 5, the second die 300 may be disposed on the first die 200 to be in a face-down state, e.g., with the bottom surface 300b facing away from the substrate 100. For example, the second die 300 may be disposed in such a way that the top surface 300a of the second die 300 faces the first die 200. Here, the top surface 300a of the second die 300 may be in contact with the top surface 200a of the first die 200. For example, the second interconnection layer 320 of the second die 300 and the first interconnection layer 220 of the first die 200 may be in contact with each other.

The second die 300 may be provided on and bonded to the first die 200. In detail, at the level of the interface between the first die 200 and the second die 300, the first die pads 224 of the first die 200 may be in direct contact with the second die pads 324 of the second die 300. Here, the first die pads 224 and the second die pads 324 may form the metal-to-metal hybrid bonding structure. For example, the first die pads 224 and the second die pads 324 may form a substantially continuous structure, and it may be hard to detect (or may be substantially free of) an interface IF6 between the first die pads 224 and the second die pads 324. For example, the first die pads 224 and the second die pads 324 may be formed of the same material (e.g., copper (Cu)), and in this case, there may be no interface between the first die pads 224 and the second die pads 324. In other words, the first die pads 224 and the second die pads 324 may be provided as a single element or unitary structure. The first die 200 and the second die 300 may be electrically connected to each other through the first die pads 224 and the second die pads 324.

In some embodiments, at the level of the interface between the first die 200 and the second die 300, the first insulating layer 226 of the first die 200 may be in direct contact with the second insulating layer 326 of the second die 300. Here, the first insulating layer 226 and the second insulating layer 326 may form an oxide-to-oxide hybrid bonding structure. For example, the first insulating layer 226 and the second insulating layer 326 may form a substantially continuous structure, and it may be hard to detect (or may be substantially free of) an interface between the first insulating layer 226 and the second insulating layer 326. In other words, the first insulating layer 226 and the second insulating layer 326 may be provided as a single element or unitary structure. Alternatively, the first insulating layer 226 and the second insulating layer 326 may be provided as separate elements.

The third die 400 may be mounted on the second die 300. As shown in FIG. 6, the third die 400 may be disposed on the second die 300 to be in a face-down state, e.g., with the bottom surface 400b facing away from the substrate 100. For example, the third die 400 may be disposed in such a way that the top surface 400a of the third die 400 faces the second die 300. Here, the top surface 400a of the third die 400 may be in contact with the bottom surface 300b of the second die 300. For example, the third interconnection layer 420 of the third die 400 may be in contact with the bottom surface 300b of the second die 300.

The third die 400 may be provided on and bonded to the second die 300. In detail, at the level of the interface between the second die 300 and the third die 400, the third die pads 424 of the third die 400 may be in direct contact with the second through electrodes 330 of the second die 300. Here, the third die pads 424 and the second through electrodes 330 may form the metal-to-metal hybrid bonding structure. For example, the third die pads 424 and the second through electrodes 330 may form a substantially continuous structure, and it may be hard to detect (or may be substantially free of) an interface IF7 between the third die pads 424 and the second through electrodes 330. For example, the third die pads 424 and the second through electrodes 330 may be formed of the same material (e.g., copper (Cu)), and in this case, there may be no interface between the third die pads 424 and the second through electrodes 330. In other words, the third die pads 424 and the second through electrodes 330 may be provided as a single element or unitary structure. The third die 400 and the second die 300 may be electrically connected to each other through the third die pads 424 and the second through electrodes 330.

In some embodiments, the second die 300 may further include the second bottom pads 340 and the bottom protection layer 342. As shown in FIG. 7, the second bottom pads 340 may be provided on the bottom surface 300b of the second die 300 and may be coupled to the second through electrodes 330. The bottom protection layer 342 may be provided near or adjacent the bottom surface 300b of the second die 300 to surround the second bottom pads 340. A top surface of the bottom protection layer 342 and a top surface of the second bottom pads 340 may be substantially coplanar with each other. The second bottom pads 340 may be formed of or include one or more conductive materials (e.g., metals). The bottom protection layer 342 may be formed of or include one or more insulating materials (e.g., silicon oxide (SiO)).

The third die 400 may be provided on and bonded to the second die 300. In detail, at the level of the interface between the second die 300 and the third die 400, the third die pads 424 of the third die 400 may be in direct contact with the second bottom pads 340 of the second die 300. Here, the third die pads 424 and the second bottom pads 340 may form the metal-to-metal hybrid bonding structure. For example, the third die pads 424 and the second bottom pads 340 may form a substantially continuous structure, and it may be hard to detect (or may be substantially free of) an interface IF8 between the third die pads 424 and the second bottom pads 340. In other words, the third die pads 424 and the second bottom pads 340 may be provided as a single element or unitary structure. The third die 400 and the second die 300 may be electrically connected to each other through the third die pads 424 and the second bottom pads 340.

Figure 8:
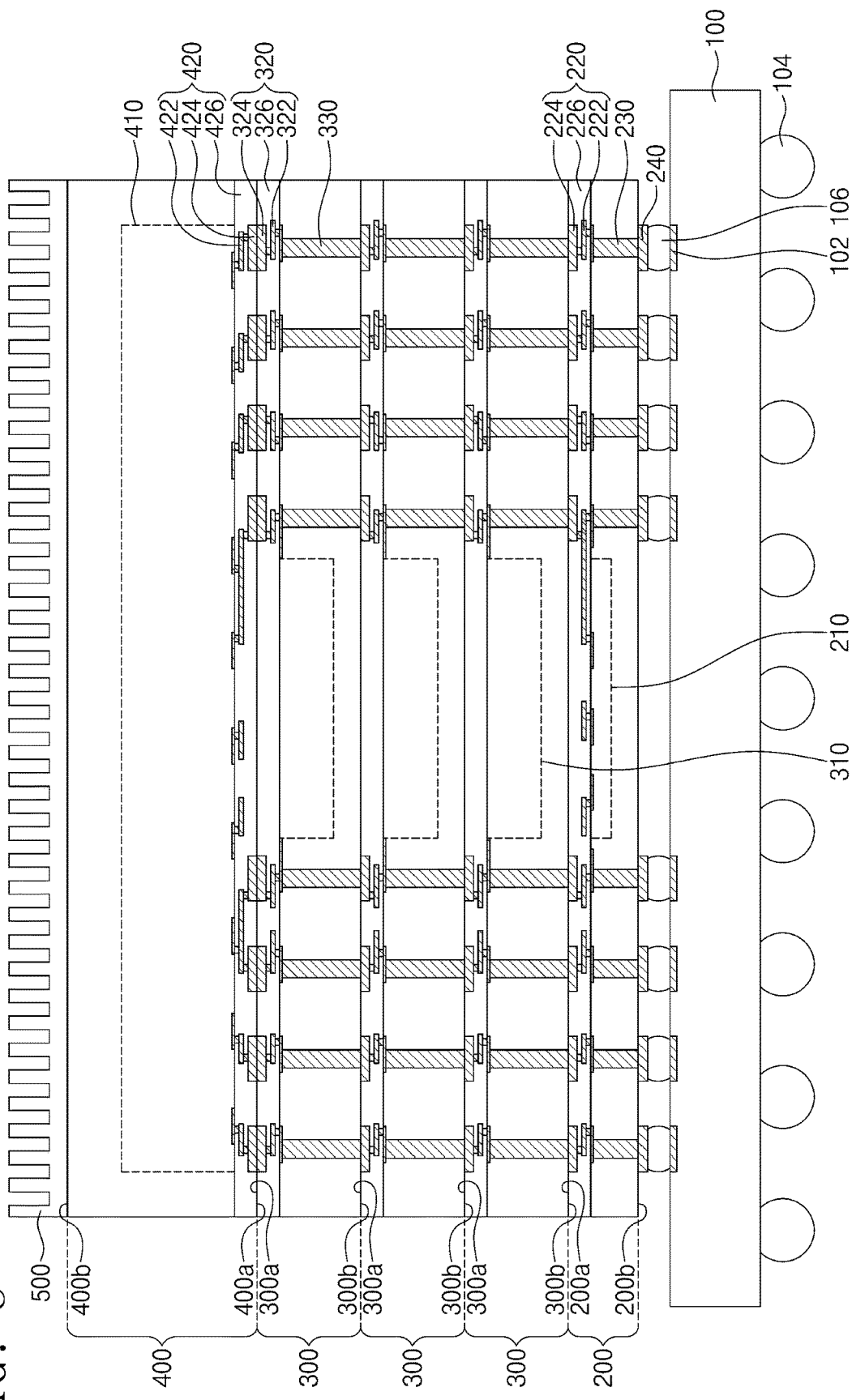
FIGS. 8 and 9 are sectional views illustrating a semiconductor package according to some embodiments of the inventive concept.
Figure 9:
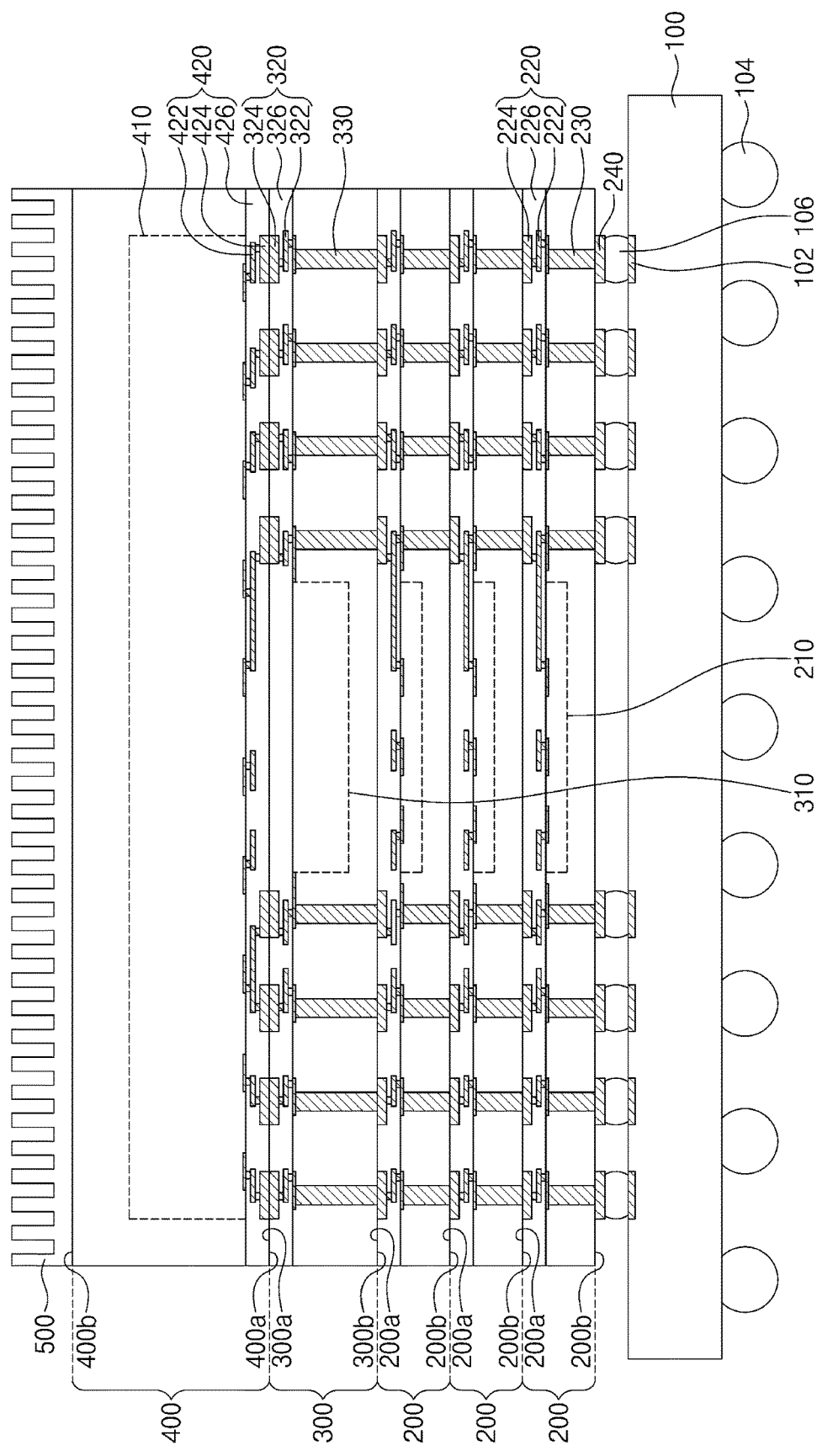

FIGS. 8 and 9 are sectional views illustrating semiconductor packages according to some embodiments of the inventive concept.

FIG. 1 illustrates an example, in which one second die 300 is provided in one die stack DS, but the inventive concept is not limited to this example. For example, as shown in FIG. 8, a plurality of the second dies 300, which are passive device dies, may be provided, and in this case, the second dies 300 may be stacked in a direction perpendicular to the substrate 100, each in a face-up state, e.g., with the top surface 300a remote from or facing away from the substrate 100. In detail, one of the second dies 300 may be stacked on the first die 200, and another of the second dies 300 may be stacked thereon. For example, the second dies 300, which are vertically stacked, may be disposed between the first die 200 and the third die 400. Here, similar to the bonding structure of the first die 200 and the second die 300 described with reference to FIG. 1, the second dies 300 may be vertically bonded to each other. For example, the bottom surface 300b of one second die 300 may be bonded to the top surface 300a of another second die 300 adjacent thereto. In other words, each pair of the second dies 300 vertically adjacent to each other may be provided to form the metal-to-metal hybrid bonding structure. The second dies 300 may include the same passive device (e.g., capacitors), but in certain embodiments, at least one of the second dies 300 may include a passive device different from the others.

FIG. 1 illustrates an example, in which one first die 200 is provided in one die stack DS, but the inventive concept is not limited to this example. As shown in FIG. 9, a plurality of the first dies 200, which are memory dies, may be provided, and in this case, the first dies 200 may be stacked in a direction perpendicular to the substrate 100, each in a face-up state, e.g., with the top surface 200a remote from or facing away from the substrate 100. In detail, a plurality of the first dies 200 may be stacked on the substrate 100, and the second die 300 may be stacked on the stack of the first dies 200. Here, similar to the bonding structure of the first die 200 and the second die 300, the first dies 200 may be vertically bonded to each other. For example, the bottom surface 200b of one first die 200 may be bonded to the top surface 200a of another first die 200 adjacent thereto. In other words, each pair of the first dies 200 vertically adjacent to each other may be provided to form the metal-to-metal hybrid bonding structure.

Figure 10:
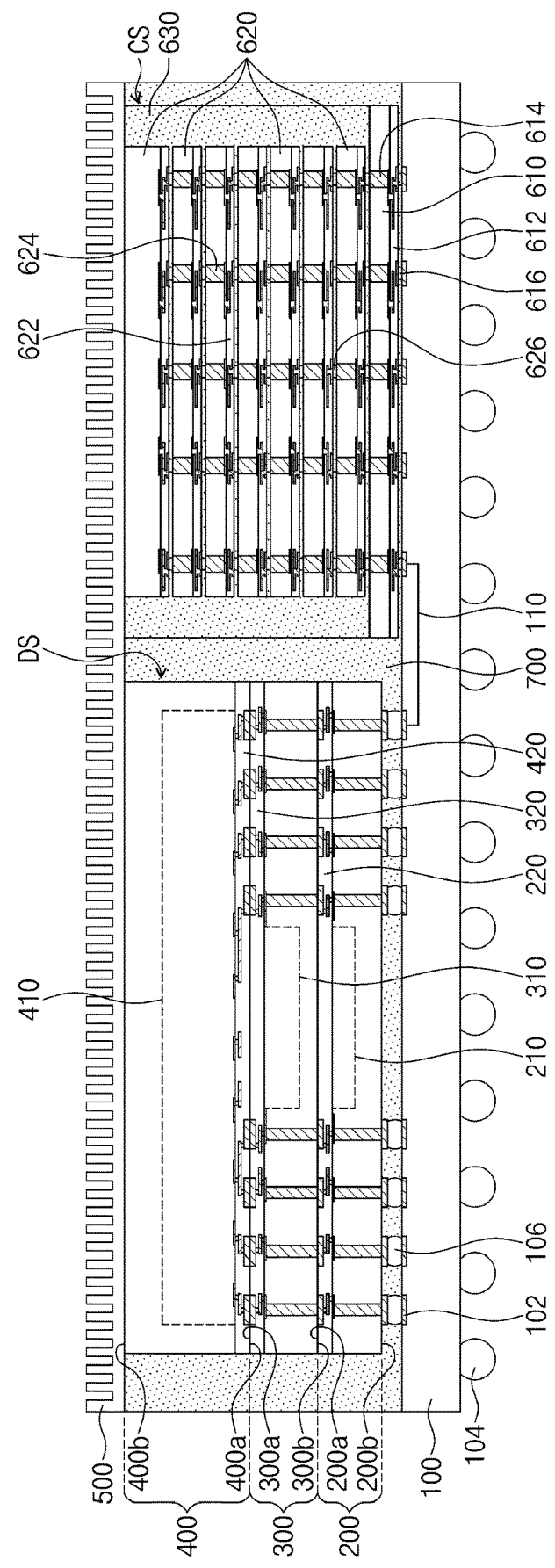
FIG. 10 is a sectional view illustrating a semiconductor package according to some embodiments of the inventive concept.

FIG. 10 is a sectional view illustrating a semiconductor package according to some embodiments of the inventive concept.

Referring to FIG. 10, a first stack DS may be disposed on the substrate 100. The first stack DS may be configured to have the same or similar structure as the die stack DS described with reference to FIG. 1.

A second stack CS may be disposed on the substrate 100. The second stack CS may be spaced apart from the first stack DS. A distance between the first stack DS and the second stack CS may range from 50 μm to 100 μm.

The second stack CS may include a first semiconductor chip 610, second semiconductor chips 620 stacked on the first semiconductor chip 610, and a first mold layer 630 enclosing the second semiconductor chips 620.

The first semiconductor chip 610 may be a base semiconductor chip. For example, the first semiconductor chip 610 may be a wafer-level semiconductor substrate, which is formed of a semiconductor material (e.g., silicon (Si)). The first semiconductor chip 610 may include a first circuit layer 612 and a first chip through electrode 614. The first circuit layer 612 may be provided on a bottom surface of the first semiconductor chip 610. The first circuit layer 612 may include an integrated circuit. For example, the first circuit layer 612 may be a memory circuit. In an embodiment, the first semiconductor chip 610 may be or include one of DRAM, SRAM, MRAM, or FLASH memory devices. Alternatively, the first semiconductor chip 610 may not include an integrated circuit. The first chip through electrode 614 may penetrate the first semiconductor chip 610 in a direction perpendicular to the top surface of the substrate 100. The first chip through electrode 614 and the first circuit layer 612 may be electrically connected to each other. The first semiconductor chip 610 may be mounted on the substrate 100 using first bumps 616, which are provided on the bottom surface of the first semiconductor chip 610.

The second semiconductor chip 620 may be mounted on the first semiconductor chip 610. In other words, the second semiconductor chip 620 and the first semiconductor chip 610 may be provided to form a chip-on-wafer (COW) structure. A width of the second semiconductor chip 620 may be smaller than a width of the first semiconductor chip 610.

The second semiconductor chip 620 may include a second circuit layer 622 and a second chip through electrode 624. The second circuit layer 622 may include a memory circuit. In an embodiment, the second semiconductor chip 620 may be or include one of DRAM, SRAM, MRAM, or FLASH memory devices. In some embodiments, the second circuit layer 622 may include the same circuit as the first circuit layer 612, but the inventive concept is not limited to this example. The second chip through electrode 624 may penetrate the second semiconductor chip 620 in a direction perpendicular to the top surface of the substrate 100. The second chip through electrode 624 and the second circuit layer 622 may be electrically connected to each other. A bottom surface of the second semiconductor chip 620 may serve as an active surface. Second bumps 626 may be provided on the bottom surface of the second semiconductor chip 620. The second bumps 626 may be provided between the first semiconductor chip 610 and the second semiconductor chip 620 to electrically connect the first semiconductor chip 610 to the second semiconductor chip 620.

In an embodiment, a plurality of the second semiconductor chips 620 may be provided. For example, a plurality of the second semiconductor chips 620 may be stacked on the first semiconductor chip 610. The second bumps 626 may be additionally formed between the second semiconductor chips 620. Here, the second semiconductor chip 620 at the highest level may not include the through electrode 624.

The first mold layer 630 may be disposed on a top surface of the first semiconductor chip 610. The first mold layer 630 may be provided to cover the first semiconductor chip 610 and to surround the second semiconductor chips 620. A top surface of the first mold layer 630 may be coplanar with a top surface of the second semiconductor chip 620 at the highest level (i.e., the uppermost chip 620 in the second stack CS), and the second semiconductor chip 620 at the highest level may not be veiled or covered by the first mold layer 630 and may be exposed. The first mold layer 630 may be formed of or include one or more insulating polymer materials. For example, the first mold layer 630 may be formed of or include an epoxy molding compound (EMC). The second stack CS may be provided to have the above-described structure.

The first stack DS and the second stack CS may be electrically connected to each other by a circuit interconnection line 110 provided in the substrate 100.

A second mold layer 700 may be provided on the substrate 100. The second mold layer 700 may cover the top surface of the substrate 100. The second mold layer 700 may enclose the first stack DS and the second stack CS. A top surface of the second mold layer 700 may be located at the same level as (i.e., substantially coplanar with) the top surfaces of the first and second stacks DS and CS. The second mold layer 700 may be formed of or include one or more insulating materials. For example, the second mold layer 700 may be formed of or include an epoxy molding compound (EMC).

The heat radiator 500 may be provided on the second mold layer 700. For example, the heat radiator 500 may be disposed to be in contact with the top surface of the first stack DS and the top surface of the second stack CS. The heat radiator 500 may be attached to the first stack DS and the second stack CS using an adhesion film (not shown). In an embodiment, the adhesion film (not shown) may include a thermal interface material (TIM), such as a thermal grease. The heat radiator 500 may be used to exhaust or dissipate heat, which is generated by the first stack DS and the second stack CS, to the outside or external to the package. The heat radiator 500 may include a heat sink. In an embodiment, the heat radiator 500 may not be provided.

FIGS. 11 to 17 are sectional views illustrating methods of fabricating a semiconductor package, according to an embodiment of the inventive concept.

Figure 11:
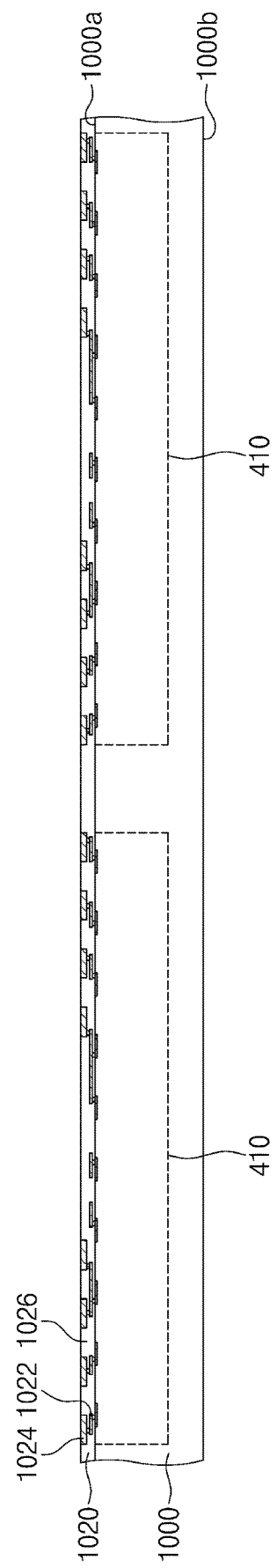
FIGS. 11 to 17 are sectional views illustrating methods of fabricating a semiconductor package, according to some embodiments of the inventive concept.

Referring to FIG. 11, a first wafer 1000 may be provided. The first wafer 1000 may be a semiconductor wafer. For example, the first wafer 1000 may be formed of or include silicon (Si), germanium (Ge), or silicon-germanium (SiGe). The first wafer 1000 may include a first surface 1000*a* and a second surface 1000*b* facing each other or on opposing sides of the first wafer 1000.

Integrated circuits 410 may be formed in the first wafer 1000. For example, the integrated circuits 410 may be formed on the first surface 1000*a* of the first wafer 1000. The integrated circuits 410 may correspond to the second integrated circuit 410 of the third die 400 described with reference to FIG. 1. The first surface 1000*a* of the first wafer 1000 may correspond to the active surfaces of the third dies 400. Thereafter, a first interconnection layer 1020 may be formed on the first surface 1000*a* of the first wafer 1000 and may be connected to the integrated circuits 410. The first interconnection layer 1020 may include a first interconnection pattern 1022 connected to the integrated circuits 410, a first insulating layer 1026 covering the first interconnection pattern 1022, and first die pads 1024, which are connected to the first interconnection pattern 1022 and are exposed to the outside or external to the first wafer 1000 near or adjacent a surface of the first insulating layer 1026.

Figure 12:
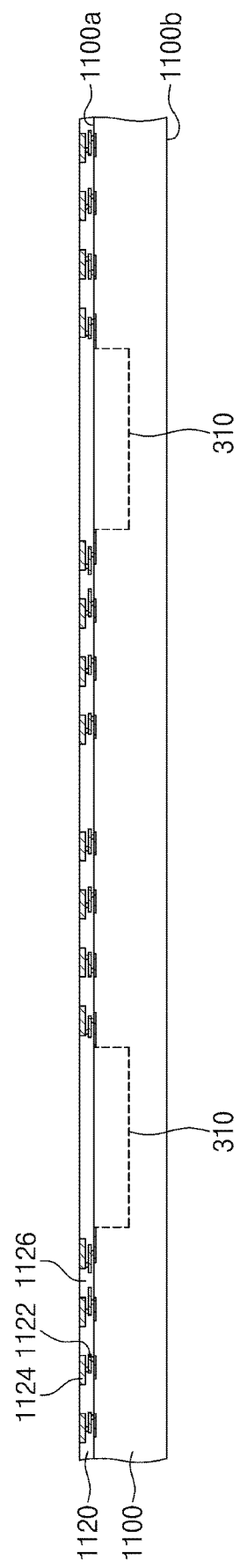

Referring to FIG. 12, a second wafer 1100 may be provided. The second wafer 1100 may be a semiconductor wafer. For example, the second wafer 1100 may be formed of or include silicon (Si), germanium (Ge), or silicon-germanium (SiGe). The second wafer 1100 may include a third surface 1100*a* and a fourth surface 1100*b* facing each other or on opposing sides of the second wafer 1100.

Passive devices 310 may be formed in the second wafer 1100. The passive devices 310 may correspond to the passive device 310 of the second die 300 described with reference to FIG. 1. For example, the third surface 1100*a* of the second wafer 1100 may correspond to the active surfaces of the second dies 300. Thereafter, a second interconnection layer 1120 may be formed on the third surface 1100*a* of the second wafer 1100 and may be connected to the passive devices 310. The second interconnection layer 1120 may include a second interconnection pattern 1122, which is connected to the passive devices 310, a second insulating layer 1126, which is provided to cover the second interconnection pattern 1122, and second die pads 1124, which are connected to the second interconnection pattern 1122 and are exposed to the outside or external to the second wafer 1100 near or adjacent a surface of the second insulating layer 1126.

Figure 13:
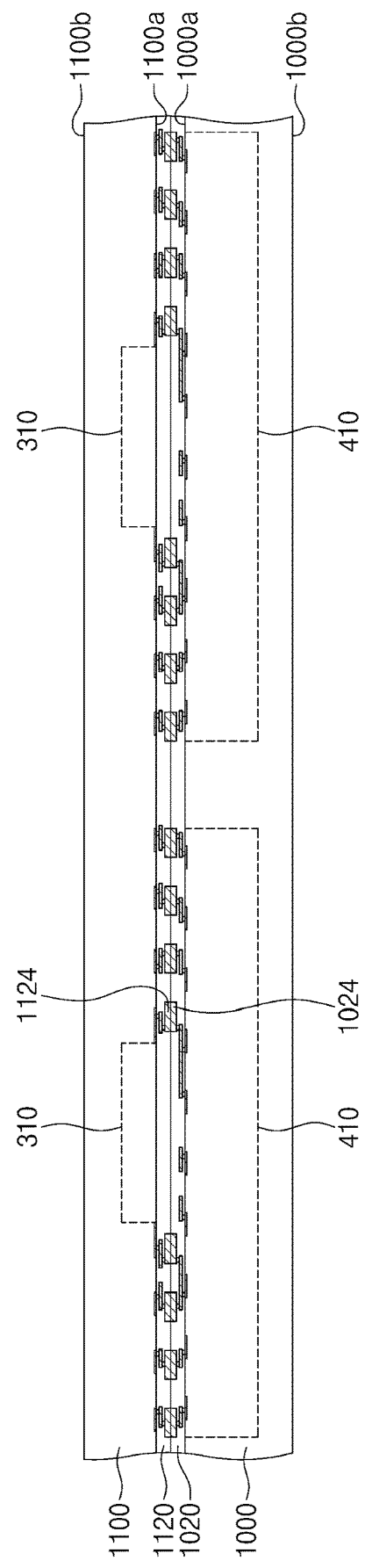

Referring to FIG. 13, the second wafer 1100 may be bonded to the first wafer 1000. In detail, the second wafer 1100 may be aligned to the first wafer 1000. The second wafer 1100 may be placed on the first wafer 1000 in such a way that the third surface 1100*a* of the second wafer 1100 faces the first surface 1000*a* of the first wafer 1000. In other words, the first wafer 1000 and the second wafer 1100 may be aligned to each other in a face-to-face manner, and the first interconnection layer 1020 of the first wafer 1000 may face the second interconnection layer 1120 of the second wafer 1100.

The second die pads 1124 of the second wafer 1100 may be bonded to the first die pads 1024 of the first wafer 1000. For example, each of the second die pads 1124 and a corresponding one of the first die pads 1024 may be bonded to form a single element or unitary structure. The bonding of the first and second die pads 1024 and 1124 may be achieved naturally. In detail, the first and second die pads 1024 and 1124 may be formed of the same material (e.g., copper (Cu)), and in this case, the first and second die pads 1024 and 1124 may be bonded to each other by a metal-to-metal (e.g., copper-to-copper) hybrid bonding process, which is naturally caused by the surface activation at interfaces of the first and second die pads 1024 and 1124 in direct contact with each other. The interface between the first and second die pads 1024 and 1124 may disappear to form the unitary structure, as a result of the bonding of the first and second die pads 1024 and 1124.

Here, to facilitate the bonding of the first and second die pads 1024 and 1124, a surface activation process may be performed on surfaces of the first and second die pads 1024 and 1124. The surface activation process may include a plasma process. In addition, to facilitate the bonding of the first and second die pads 1024 and 1124, pressure and heat may be applied to the first wafer 1000 and the second wafer 1100. For example, pressure of about 30 MPa or less may be applied to the first wafer 1000 and the second wafer 1100, and/or an annealing process may be performed at temperature of about 100° C. to 500° C. However, the inventive concept is not limited to these examples, and the pressure and/or temperature condition for the hybrid bonding process may be variously changed.

In some embodiments, the first insulating layer 1026 of the first interconnection layer 1020 may be bonded to the second insulating layer 1126 of the second interconnection layer 1120, during the process of bonding the first wafer 1000 and the second wafer 1100. For example, the first and second insulating layers 1026 and 1126 may be bonded to form a single insulating layer or unitary structure. The bonding of the first and second insulating layers 1026 and 1126 may be achieved naturally. In detail, the first and second insulating layers 1026 and 1126 may be formed of the same material (e.g., silicon oxide), and in this case, the first and second insulating layers 1026 and 1126 may be bonded to each other by an oxide-to-oxide bonding process, which is naturally caused by the surface activation at an interface of the first and second insulating layers 1026 and 1126. The interface between the first and second insulating layers 1026 and 1126 may disappear to form the unitary structure, as a result of the bonding of the first and second insulating layers 1026 and 1126.

Figure 14:
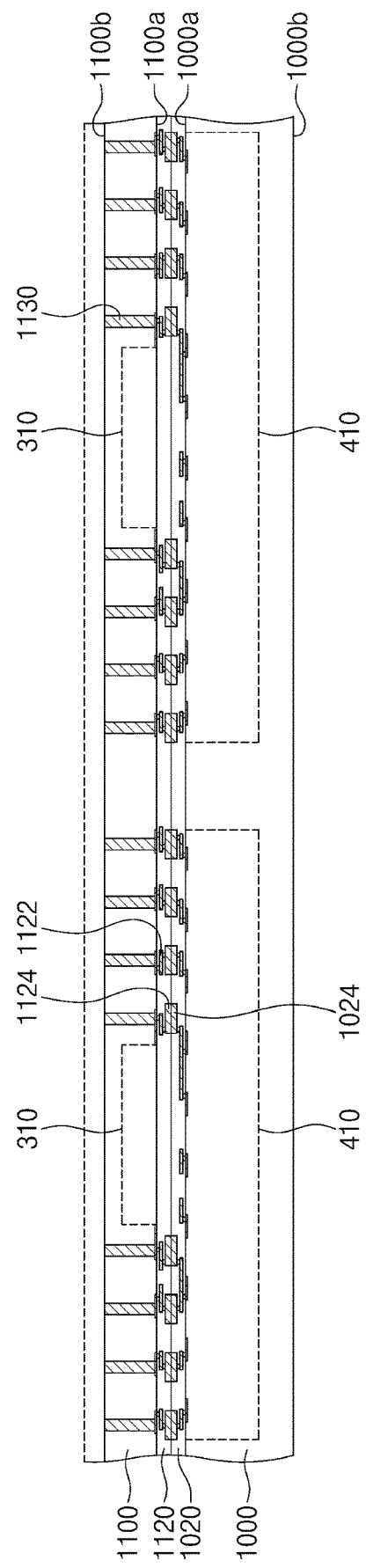

Referring to FIG. 14, a portion of the second wafer 1100 may be removed. In detail, the second wafer 1100 may be thinned. For example, a carrier substrate may be attached to the second surface 1000b of the first wafer 1000, and then, a grinding process may be performed on the fourth surface 1100b of the second wafer 1100.

The carrier substrate may be removed, and then, through holes may be formed in the second wafer 1100. The through holes may be formed to penetrate the second wafer 1100 and to expose the second interconnection pattern 1122.

First through electrodes 1130 may be formed in the through holes. For example, a deposition or plating process may be performed to form a conductive material, which fills the through holes and extends on or covers the fourth surface 1100b of the second wafer 1100, on the second wafer 1100. Thereafter, the conductive material may be removed from the fourth surface 1100b of the second wafer 1100.

Figure 15:
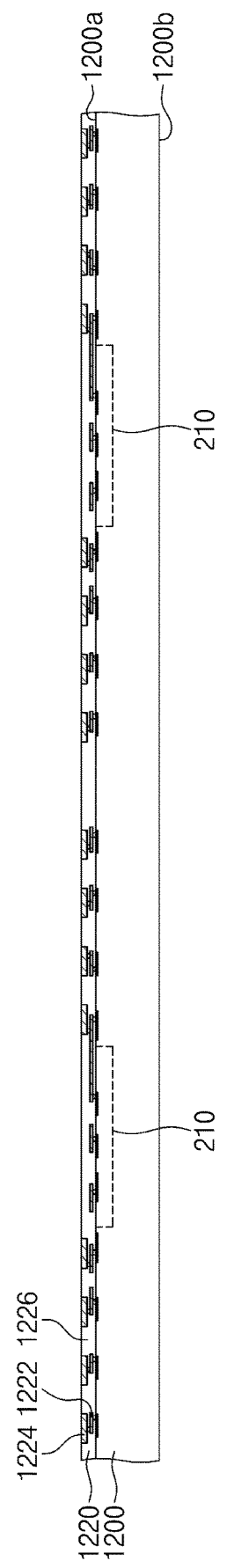

Referring to FIG. 15, a third wafer 1200 may be provided. The third wafer 1200 may be a semiconductor wafer. For example, the third wafer 1200 may be formed of or include silicon (Si), germanium (Ge), or silicon-germanium (SiGe). The third wafer 1200 may include a fifth surface 1200a and a sixth surface 1200b facing each other or on opposing sides of the third wafer 1200.

Integrated circuits 210 may be formed in the third wafer 1200. For example, the integrated circuits 210 may be formed in a region adjacent to the fifth surface 1200a of the third wafer 1200. The integrated circuits 210 may correspond to the first integrated circuit 210 of the first die 200 described with reference to FIG. 1. The fifth surface 1200a of the third wafer 1200 may correspond to the active surfaces of the first dies 200. Next, a third interconnection layer 1220 may be formed on the fifth surface 1200a of the third wafer 1200 to be connected to the integrated circuits 210. The third interconnection layer 1220 may include a third interconnection pattern 1222, which is connected to the integrated circuits 210, a third insulating layer 1226, which is provided to cover the third interconnection pattern 1222, and third die pads 1224, which are connected to the third interconnection pattern 1222 and are exposed to the outside or external to the third wafer 1200 near or adjacent a surface of the third insulating layer 1226.

Figure 16:
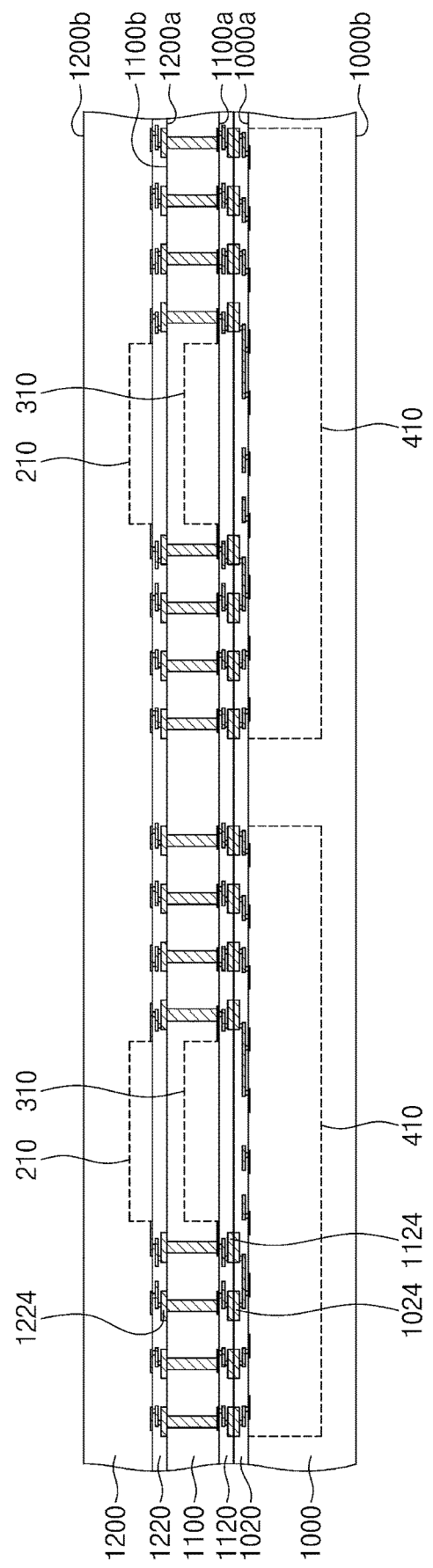

Referring to FIG. 16, the third wafer 1200 may be bonded to the second wafer 1100. In detail, the third wafer 1200 may be aligned to the second wafer 1100. The third wafer 1200 may be placed on the second wafer 1100 in such a way that the fifth surface 1200a of the third wafer 1200 faces the fourth surface 1100b of the second wafer 1100. For example, the third wafer 1200 and the second wafer 1100 may be aligned to each other in a face-to-back manner, and the third interconnection layer 1220 of the third wafer 1200 may face the fourth surface 1100b of the second wafer 1100.

The third die pads 1224 of the third wafer 1200 may be bonded to the first through electrodes 1130 of the second wafer 1100. For example, the third die pad 1224 and the first through electrode 1130 may be bonded to form a single element or unitary structure. The bonding of the third die pads 1224 and the first through electrodes 1130 may be achieved naturally. In detail, the third die pads 1224 and the first through electrodes 1130 may be formed of the same material (e.g., copper (Cu)), and in this case, each of the third die pads 1124 may be bonded to a corresponding one of the first through electrodes 1130 by a metal-to-metal (e.g., copper-to-copper) hybrid bonding process, which is naturally caused by the surface activation at interfaces between the third die pads 1124 and the first through electrodes 1130 in direct contact with each other. The interfaces between the third die pads 1124 and the first through electrodes 1130 may disappear to define the unitary structure, as a result of the bonding of the third die pads 1124 and the first through electrodes 1130.

Figure 17:
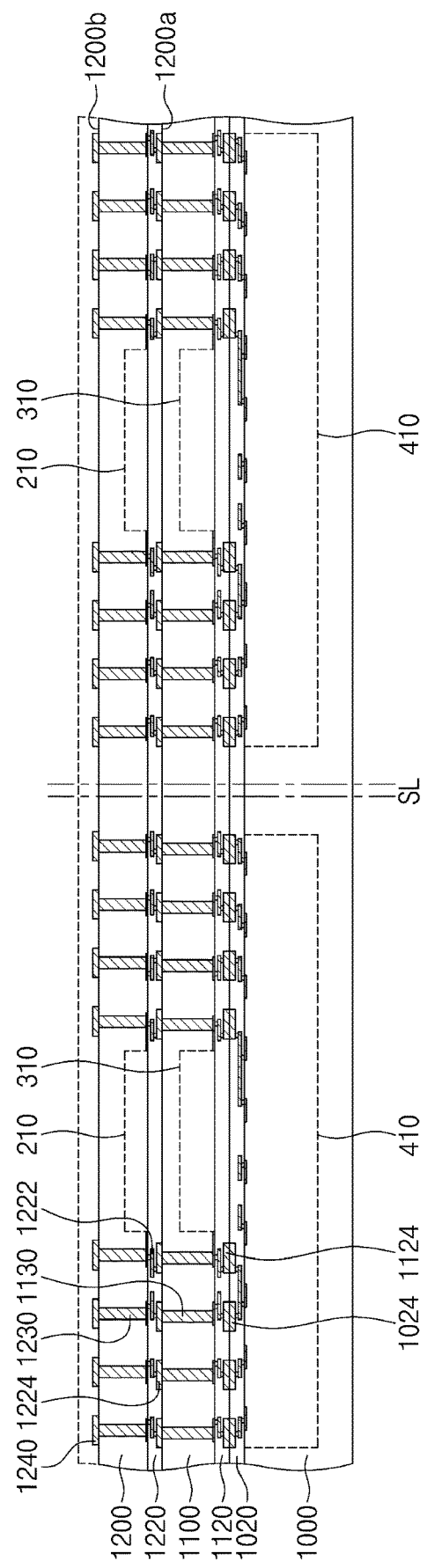

Referring to FIG. 17, a portion of the third wafer 1200 may be removed. In detail, the third wafer 1200 may be thinned. For example, a carrier substrate may be attached to the second surface 1000b of the first wafer 1000, and then, a grinding process may be performed on the sixth surface 1200b of the third wafer 1200.

The carrier substrate may be removed, and then, through holes may be formed in the third wafer 1200. The through holes may be formed to penetrate the third wafer 1200 and to expose the third interconnection pattern 1222.

Second through electrodes 1230 may be formed in the through holes. For example, a deposition or plating process may be performed to form a conductive material, which fills the through holes and extends on or covers the sixth surface 1200b of the third wafer 1200, on the third wafer 1200. Thereafter, the conductive material may be removed from the sixth surface 1200b of the third wafer 1200.

Bottom pads 1240 may be formed on the sixth surface 1200b of the third wafer 1200. For example, a deposition or plating process may be performed to form a conductive material on or covering the sixth surface 1200b of the third wafer 1200. The conductive material on the sixth surface 1200b of the third wafer 1200 may be patterned to form the bottom pads 1240. Alternatively, the bottom pads 1240 may be formed by using the process of forming the second through electrodes 1230.

Thereafter, the first wafer 1000, the second wafer 1100, and the third wafer 1200 may be cut or diced to form the third dies 400, the second dies 300, and the first dies 200 (e.g., see FIG. 1), which are separated from each other. For example, a singulation process may be performed on the first wafer 1000, the second wafer 1100, and the third wafer 1200 along a sawing line SL. Accordingly, the first wafer 1000, the second wafer 1100, and the third wafer 1200 may be divided into the die stacks DS, which are separated apart from each other. Each of the die stacks DS may be substantially the same as the die stack DS of FIG. 1.

Referring back to FIG. 1, the die stack DS may be mounted on the substrate 100. The die stack DS may be mounted on the substrate 100 in a flip chip manner. For example, the die stack DS may be electrically connected to the substrate 100 through connection terminals 106 (e.g., solder balls or solder bumps), which are provided between the substrate pads 102 of the substrate 100 and the first bottom pad (e.g., corresponding to the bottom pad 1240 of FIG. 17) of the first die 200.

The heat radiator 500 may be formed on the die stack DS. For example, the heat radiator 500 may be attached to the bottom surface 400b of the third die 400 using an adhesion film (not shown). In some embodiments, the adhesion film (not shown) may include a thermal interface material (TIM), such as a thermal grease.

The semiconductor package may be fabricated through the above-described process.

According to some embodiments of the inventive concept, a semiconductor package may include a second interconnection layer and a third interconnection layer, which are bonded to each other by a metal-to-metal or oxide-to-oxide bonding method providing a strong bonding strength. This may improve the structural stability of the semiconductor package.

In addition, a logic die and a capacitor die may be bonded in such a way that their active surfaces face each other, and in this case, a length of an electrical connection path between an integrated device of the logic die and a passive device of the capacitor die may be shortened. Furthermore, the logic die may be directly connected to the capacitor die, and in this case, noise in electrical signals output from the logic die may be reduced. Accordingly, electrical characteristics of the semiconductor package may be improved.

According to some embodiments of the inventive concept, the logic die may be placed at the uppermost or highest level of the die stack. In this case, a comparatively large amount of heat, which may be produced by the logic die during operation of the logic die, may be more easily exhausted to the outside or external to the package.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
a substrate;
a first stack on the substrate;
a second stack on the substrate and spaced apart from the first stack; and
a first mold layer enclosing the first stack and the second stack on the substrate,
wherein the first stack comprises:
a first die comprising a first active surface opposite to the substrate;
a second die on the first die and comprising a second active surface opposite to the first die; and
a third die on the second die and comprising a third active surface facing the second active surface,
wherein the second stack comprises:
a first semiconductor chip;
second semiconductor chips stacked on the first semiconductor chip; and
a second mold layer enclosing the second semiconductor chips on the first semiconductor chip,
wherein the first die, the second die, and the third die further comprise first pads, second pads, and third pads, which are on the first active surface, the second active surface, and the third active surface, respectively,
wherein each pair of the second and third pads defines a unitary structure of a same material,
wherein the second die comprises a passive device including a capacitor adjacent the second active surface, and the third die comprises a logic device adjacent the third active surface.

2. The semiconductor package of claim 1, wherein the second active surface of the second die is in direct contact with the third active surface of the third die.

3. The semiconductor package of claim 1, wherein
the first die comprises a memory device adjacent the first active surface, and
wherein the second die is coupled to the third pads by through electrodes penetrating the second die.

4. The semiconductor package of claim 1, wherein the second semiconductor chips comprise a memory chip.

5. The semiconductor package of claim 1, further comprising:
a heat-radiation member on a third inactive surface of the third die opposite to the third active surface.

6. The semiconductor package of claim 1, wherein the first die, the second die, and the third die have a same width and comprise respective side surfaces that are coplanar with each other.

7. The semiconductor package of claim 1, wherein the first active surface of the first die is in direct contact with a first inactive surface of the second die, which is opposite to the second active surface.

8. The semiconductor package of claim 7, wherein the first die comprises first through electrodes vertically penetrating the first die, the second die comprises second through electrodes vertically penetrating the second die, and the second die is coupled to the first pads by the second through electrodes penetrating the second die.

9. The semiconductor package of claim 8, wherein the second through electrodes of the second die extend from the second pads toward the first inactive surface and are exposed adjacent the first inactive surface, and
wherein the second through electrodes are in contact with the first pads of the first die.

10. The semiconductor package of claim 8, wherein the first die further comprises fourth pads on a second inactive surface opposite to the first active surface, and wherein the first through electrodes penetrate the first die and are coupled to the first pads and the fourth pads.

11. The semiconductor package of claim 10, further comprising connection terminals between the substrate and the first stack,
wherein the connection terminals are between substrate pads of the substrate and the fourth pads of the first die.

12. A semiconductor package, comprising:
a substrate;
a logic die on the substrate, the logic die comprising a first active surface;
a passive device die between the substrate and the logic die, the passive device die comprising a second active surface;
a memory die between the substrate and the passive device die, the memory die comprising a third active surface that is in contact with a first inactive surface of the passive device die opposite to the second active surface; and
a chip stack on the substrate and spaced apart from the memory die, the passive device die and the logic die, wherein the chip stack comprises:
a base semiconductor chip;
memory chips stacked on the base semiconductor chip; and a mold layer enclosing the memory chips on the base semiconductor chip, wherein the logic die, the passive device die, and the memory die further comprise first pads, second pads, and third pads, which are on the first active surface, the second active surface, and the third active surface, respectively, and wherein the passive device die is coupled to the third pads by first through electrodes penetrating the passive device die.

13. The semiconductor package of claim 12, wherein the first active surface faces the substrate, and the second active surface is in contact with the first active surface.

14. The semiconductor package of claim 12, wherein each pair of the first and second pads defines a unitary structure of a same material.

15. The semiconductor package of claim 12, wherein the passive device die further comprises fourth pads on the first inactive surface, wherein the first through electrodes penetrate the passive device die and are coupled to the second pads and the fourth pads, and wherein each pair of the third and fourth pads defines a unitary structure of a same material.

16. The semiconductor package of claim 12, wherein a side surface of the memory die, a side surface of the passive device die, and a side surface of the logic die are coplanar with each other.

17. The semiconductor package of claim 12, wherein the passive device comprises a capacitor, a resistor, or an inductor.

18. The semiconductor package of claim 12, wherein the memory die further comprises fifth pads on a second inactive surface opposite to the third active surface, and wherein the memory die is mounted on the substrate by through connection terminals between substrate pads of the substrate and the fifth pads.

19. The semiconductor package of claim 18, wherein the memory die further comprises second through electrodes that penetrate the memory die and connect the third pads to the fifth pads.

20. A semiconductor package, comprising:
a substrate;
a first stack on the substrate;
a second stack on the substrate and spaced apart from the first stack such that the first and second stacks are non-overlapping in plan view; and
a first mold layer on the first stack and the second stack on the substrate,
wherein the first stack comprises:
a first die comprising a first active surface opposite to the substrate;
a second die on the first die and comprising a passive device adjacent a second active surface opposite to the first die; and
a third die on the second die and comprising a logic device adjacent a third active surface facing the second active surface,
wherein the second stack comprises:
a first semiconductor chip;
second semiconductor chips stacked on the first semiconductor chip; and
a second mold layer on the second semiconductor chips on the first semiconductor chip,
wherein the first die, the second die, and the third die further comprise first pads, second pads, and third pads, which are on the first active surface, the second active surface, and the third active surface, respectively,
wherein the first stack comprises a wafer-on-wafer (WOW) structure, wherein the first, second, and third dies have a same width and respective side surfaces that are aligned, and
wherein the second stack comprises a chip-on-wafer (COW) structure, wherein the first semiconductor chip and the second semiconductor chips have different widths.

* * * * *